United States Patent
Choi et al.

(10) Patent No.: US 8,026,759 B2
(45) Date of Patent: Sep. 27, 2011

(54) MULTISTAGE AMPLIFYING CIRCUIT

(75) Inventors: Michael Choi, Seoul (KR); Ho-jin Park, Suwon-si (KR); Eun-seok Shin, Hwaseong-si (KR); Kyoung-jun Moon, Hwaseong-si (KR); Seung-hoon Lee, Seoul (KR); Kyung-hoon Lee, Seoul (KR); Young-ju Kim, Seoul (KR); Se-won Lee, Seoul (KR); Beom-soo Park, Seoul (KR)

(73) Assignees: Samsung Electronics Co., Ltd., Suwon-Si (KR); Sogang University, Seoul (KR)

( * ) Notice: Subject to any disclaimer, the term of this patent is extended or adjusted under 35 U.S.C. 154(b) by 0 days.

(21) Appl. No.: 12/841,558

(22) Filed: Jul. 22, 2010

(65) Prior Publication Data

US 2011/0037520 A1    Feb. 17, 2011

(30) Foreign Application Priority Data

Aug. 11, 2009  (KR) .................. 10-2009-0074009

(51) Int. Cl.
*H03F 1/02* (2006.01)
(52) U.S. Cl. ............. 330/9; 330/310; 330/69; 330/302; 330/150
(58) Field of Classification Search .............. 330/9, 310, 330/69, 302, 124 R, 150
See application file for complete search history.

(56) References Cited

U.S. PATENT DOCUMENTS

| | | | |
|---|---|---|---|
| 5,099,239 A * | 3/1992 | Bruce et al. ................. 341/155 |
| 5,293,169 A * | 3/1994 | Baumgartner et al. ........ 341/172 |
| 5,642,075 A * | 6/1997 | Bell ............................... 330/129 |
| 6,031,480 A * | 2/2000 | Soenen et al. ................. 341/161 |
| 6,271,784 B1 * | 8/2001 | Lynn et al. ..................... 341/150 |
| 6,288,665 B1 * | 9/2001 | Tsukamoto et al. ........... 341/155 |
| 6,985,030 B2 * | 1/2006 | Shimizu et al. ................... 330/9 |
| 7,265,705 B1 | 9/2007 | Lee et al. |
| 7,408,496 B2 | 8/2008 | Cho |
| 7,755,531 B2 * | 7/2010 | Yeom ............................ 341/166 |

FOREIGN PATENT DOCUMENTS

KR   100801962     1/2008
KR   1020080024676  3/2008

* cited by examiner

*Primary Examiner* — Patricia Nguyen
(74) *Attorney, Agent, or Firm* — F. Chau & Associates, LLC.

(57) ABSTRACT

A multistage amplifying circuit includes a first amplifying circuit that either samples a first analog voltage input or amplifies a difference between the first analog voltage and a first digital voltage converted from the first analog voltage, in response to a control signal. A second amplifying circuit either samples a second analog voltage input or amplifies a difference between the second analog voltage and a second digital voltage converted from the second analog voltage, in response to the control signal. A common amplifier receives output voltages of the first amplifying circuit and the second amplifying circuit and either resets the output voltage of the first amplifying circuit and determines an output voltage by using the second amplifying circuit, or resets the output voltage of the second amplifying circuit and determines an output voltage by using the first amplifying circuit, in response to the control signal.

16 Claims, 5 Drawing Sheets

FIG. 5A

MULTISTAGE AMPLIFYING CIRCUIT

CROSS-REFERENCE TO RELATED APPLICATION

This application claims priority to and the benefit of Korean Patent Application No. 10-2009-0074009, filed on Aug. 11, 2009, in the Korean Intellectual Property Office, the entire content which is incorporated by reference herein.

BACKGROUND

The present disclosure relates to amplifiers, and, more particularly, to a multistage amplifying circuit connected to a plurality of amplifying circuits.

Limiter amplifiers of a frequency modulation (FM) radio receiver, or intermediate frequency (IF) amplifiers of an amplitude modulation (AM) radio receiver typically use multistage amplifying circuits to achieve a high gain by amplifying minute input signals, and can achieve a high gain ratio by dependently connecting a plurality of amplifying circuits in various stages. A need exists for multistage amplifying circuits which can output through a common amplifier a plurality of analog input voltages.

SUMMARY

Exemplary embodiments of the present inventive concept provide multistage amplifying circuits which can alternatively sample and output through a common amplifier a plurality of analog input voltages.

According to an exemplary embodiment of the inventive concept, a multistage amplifying circuit includes a first amplifying circuit that, alternatively in response to a control signal: samples a first analog voltage input to the first amplifying circuit, or amplifies a difference between the first analog voltage and a first digital voltage converted from the first analog voltage. A second amplifying circuit, alternatively in response to the control signal: samples a second analog voltage input to the second amplifying circuit, or amplifies a difference between the second analog voltage and a second digital voltage converted from the second analog voltage. The first amplifying circuit and the second amplifying circuit complement each other. A common amplifier receives an output voltage of the first amplifying circuit and an output voltage of the second amplifying circuit. The common amplifier, alternatively in response to the control signal: resets the output voltage of the first amplifying circuit and determines an output voltage by using the second amplifying circuit, or resets the output voltage of the second amplifying circuit and determines the output voltage by using the first amplifying circuit.

The multistage amplifying circuit may further include a first capacitor having a first end connected to an output terminal of the common amplifier, and a connection control unit having an end connected to a second end of the first capacitor, and that connects the first capacitor to an output terminal of the first amplifying circuit or an output terminal of the second amplifying circuit, in response to the control signal.

The first amplifying circuit may include a first amplifier having an output terminal connected to a first input terminal of the common amplifier, a second capacitor and a third capacitor each having a first end connected to an input terminal of the first amplifier, a second switch and a third switch each having an end respectively connected to a second end of each of the second capacitor and the third capacitor, and that applies the first analog voltage to the second capacitor and the third capacitor, in response to the control signal, a fourth switch having an end connected to the second end of the third capacitor, and that applies the first digital voltage to the third capacitor, in response to the control signal, and a fifth switch having an end connected to the second end of the second capacitor, and that connects the second capacitor to an output terminal of the common amplifier, in response to the control signal.

The second amplifying circuit may include a second amplifier connected to an output terminal connected to a second input terminal of the common amplifier, a fourth capacitor and a fifth capacitor each having a first end connected to an input terminal of the second amplifier, a sixth switch and a seventh switch each having an end respectively connected to a second end of each of the fourth capacitor and the fourth capacitor, and that applies the second analog voltage to the fourth capacitor and the fifth capacitor, in response to the control signal, an eighth switch having an end connected to the second end of the fifth capacitor, and that applies the second digital voltage to the fifth capacitor, in response to the control signal, and a ninth switch having an end connected to the second end of the fourth capacitor, and that connects the fourth capacitor to an output terminal of the common amplifier, in response to the control signal.

The common amplifier may include a first current generating unit having a first end connected to a first power voltage, and that generates a current in response to a first bias voltage applied to the first current generating unit, a first amplifying unit having a first end connected to a second end of the first current generating unit, and that amplifies or that resets the output voltage of the first amplifying circuit differentially input in response to the control signal, a second amplifying unit having a first end connected to a second end of the first amplifying unit, and that amplifies or that resets the output voltage of the second amplifying circuit differentially input in response to the control signal, wherein the first amplifying unit and the second amplifying unit complement each other, and a second generating unit having an end connected to a second end of the second amplifying unit, and that generates a current in response to a second bias voltage applied to the second generating unit.

The second analog voltage may be an output voltage of the common amplifier determined by using the first amplifying circuit.

According to an exemplary embodiment of the inventive concept a multistage amplifying circuit includes a common amplifying circuit that receives a first input voltage and a second input voltage. The common amplifying circuit is configured to alternatively in response to a control signal: reset the first input voltage and amplify the second input voltage, or reset the second input voltage and amplify the first input voltage. A first control circuit, alternatively in response to the control signal: samples a first analog voltage input to the first control circuit, or amplifies the first input voltage as a difference between the first analog voltage and a first digital voltage converted from the first analog voltage by using the common amplifying circuit, to determine an output voltage of the common amplifying circuit. A second control circuit, alternatively in response to the control signal: samples a second analog voltage input to the second control circuit, or amplifies the second input voltage as a difference between the second analog voltage and a second digital voltage converted from the second analog voltage by using the common amplifying circuit, to determine an output voltage of the common amplifying circuit. The first control circuit and the second control circuit complement each other.

The common amplifying circuit may include a first common amplifier that receives the first input voltage and the second input voltage and may be configured to, in response to the control signal, reset the first input voltage and to amplify the second input voltage or to reset the second input voltage and amplify the first input voltage, and a second common amplifier may be configured to amplify an output voltage of the first common amplifier. A capacitor may have a first end connected to an output terminal of the first common amplifier, and a second end connected to an output terminal of the second common amplifier.

The first common amplifier may include a first current generating unit having a first end connected to a first power voltage and that generates a current in response to a first bias voltage applied to the first current generating unit, a first amplifying unit having a first end connected to a second end of the first current generating unit and that amplifies or resetting the first input voltage that is differentially input in response to the control signal, a second amplifying unit that amplifies or resets the second input voltage differentially input in response to the control signal. The first amplifying unit and the second amplifying unit complement each other. A gain elevation unit has a first end connected to a second end of the first amplifying unit, and a second end connected to a first end of the second amplifying unit, The gain elevation unit is configured to elevate a voltage amplifying rate of the first amplifying unit or to elevate a voltage amplifying rate of the second amplifying unit. A second current generating unit is connected to a second end of the second amplifying unit, and generates a current in response to a second bias voltage applied to the second current generating unit.

The first common amplifier may include a first current generating unit having a first end connected to a first power voltage and that generates a current in response to a first bias voltage applied to the first current generating unit, a first amplifying unit that amplifies the first input voltage differentially input in response to the control signal, a second amplifying unit that amplifies the second input voltage differentially input in response to the control signal, a gain elevation unit having a first end connected to a second end of the first current generating unit, and a second end connected to an end of the first amplifying unit and an end of the second amplifying unit. The gain elevation unit is configured to elevate a voltage amplifying rate of the first amplifying unit, or to elevate a voltage amplifying rate of the second amplifying unit. A second current generating unit has a first end connected to a second power voltage and that generates a current in response to a second bias voltage applied to the second current generating unit. A connection control unit has an end connected to a second end of the second current generating unit and that connects a second end of the first amplifying unit or a second end of the second amplifying unit to a second end of the second current generating unit, in response to the control signal.

According to an exemplary embodiment of the inventive concept multistage amplifier circuit includes a first amplifying circuit that, in response to a control signal, either samples a first analog voltage input or amplifies a difference between the first analog voltage and a first digital voltage converted from the first analog voltage. A second amplifying circuit, in response to the control signal, either samples a second analog voltage input or amplifies a difference between the second analog voltage and a second digital voltage converted from the second analog voltage. A common amplifier, in response to the control signal, receives output voltages of the first amplifying circuit and the second amplifying circuit and either: resets the output voltage of the first amplifying circuit and determines an output voltage of the multistage amplifier circuit by using the second amplifying circuit, or resets the output voltage of the second amplifying circuit and determines an output voltage of the multistage amplifier circuit by using the first amplifying circuit.

The second amplifying circuit may be configured to perform an amplifying operation when the first amplifying circuit performs a sampling operation and may be configured to perform a sampling operation when the first amplifying circuit performs an amplifying operation.

The control signal may be of a first logic state or a second logic state.

When the control signal is in the first logic state the first amplifying circuit may sample the first analog voltage and the second amplifying circuit may amplify the difference between the second analog voltage and the second digital voltage.

When the control signal is in the second logic state the first amplifying circuit may amplify the difference between the first analog voltage and the first digital voltage, and the second amplifying circuit may sample the second analog voltage.

When the control signal is in the first logic state the common amplifier may reset the output voltage of the first amplifying circuit and determine the output voltage of the multistage amplifier circuit using the second amplifying circuit.

When the control signal is in the second logic state the common amplifier may reset the output voltage of the second amplifying circuit and determine the output voltage of the multistage amplifier circuit using the first amplifying circuit.

The multistage amplifier may further include a compensation capacitor, and a connection control unit configured to connect the compensation capacitor between an output terminal of the common amplifier and an output terminal of the first amplifying circuit or between the output terminal of the common amplifier and an output terminal of the second amplifying circuit. When the control signal is in the first logic state the connection control unit connects the compensation capacitor to the output terminal of the second amplifying circuit and when the control signal is in the second logic state the connection control unit connects the compensation capacitor to the output terminal of the first amplifying circuit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, exemplary embodiments of the inventive concept will be described in detail with reference to the attached drawings. Like reference numerals in the drawings denote like elements.

Figure 1:
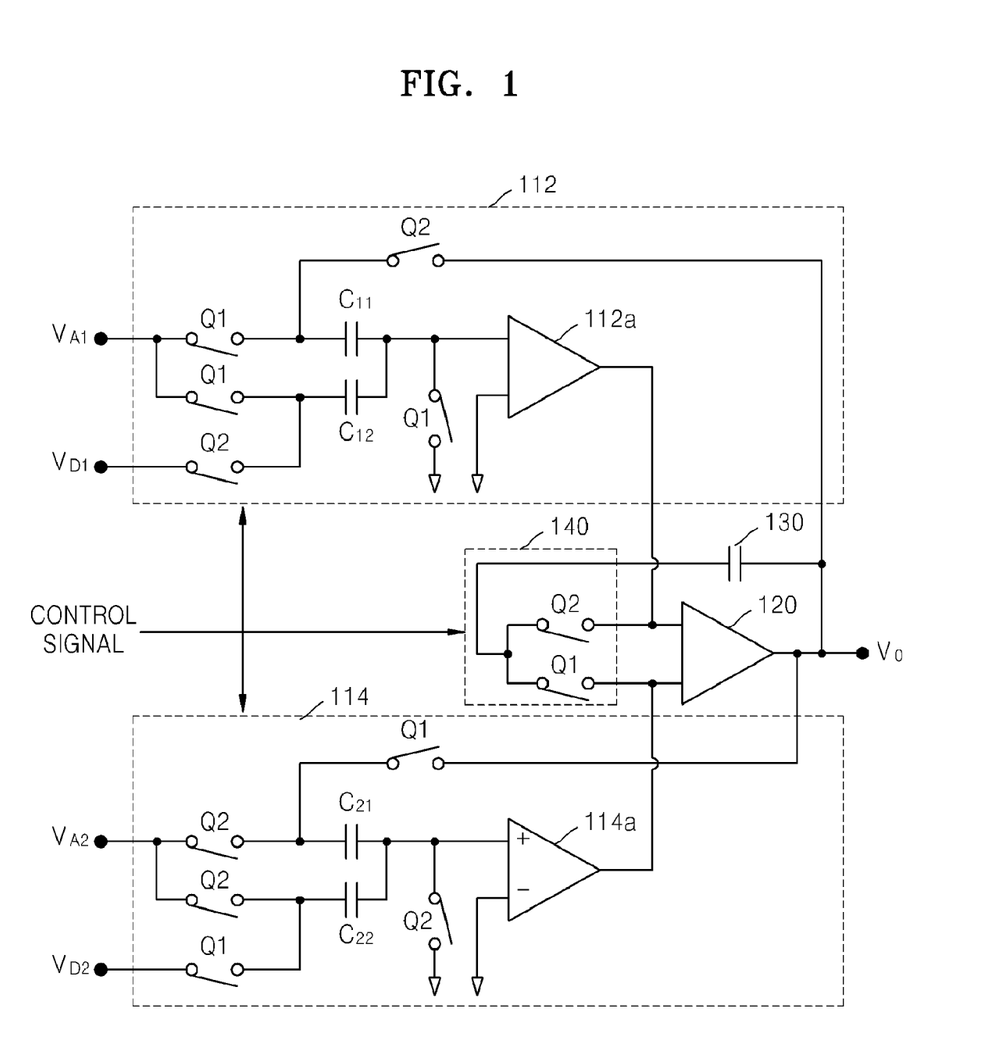
FIG. 1 is a circuit diagram of a multistage amplifying circuit according to an exemplary embodiment of the inventive concept.

FIG. 1 is a circuit diagram of a multistage amplifying circuit according to an exemplary embodiment of the inventive concept. The multistage amplifying circuit includes a first amplifying circuit 112, a second amplifying circuit 114, a common amplifier 120, a compensation capacitor 130 and a connection control unit 140.

The first amplifying circuit 112 samples a first analog voltage $V_{A1}$ input thereto, or amplifies a difference $V_{A1}$-$V_{D1}$ between the first analog voltage $V_{A1}$ and a first digital voltage $V_{D1}$ converted from the first analog voltage $V_{A1}$, in response to a control signal.

In more detail, when the control signal is in a first logic state switches Q1 are closed and the first amplifying circuit 112 samples the first analog voltage $V_{A1}$ through capacitors C11, C12.

In exemplary embodiments throughout this disclosure the switches Q1 may be transistors to whose gate the control signal is applied.

In addition, when the control signal is in a second logic state switches Q2 are closed and the first amplifying circuit 112 amplifies the difference $V_{A1}$-$V_{D1}$ between the first analog voltage $V_{A1}$ and the first digital voltage $V_{D1}$ through a first amplifier 112a.

In exemplary embodiments throughout this disclosure the switches Q2 may be transistors to whose gate the control signal is applied.

The first digital voltage $V_{D1}$ is less than the first analog voltage $V_{A1}$, and indicates a digital voltage value that is the most approximate to the first analog voltage $V_{A1}$. The first analog voltage $V_{A1}$ and the first digital voltage $V_{D1}$ may be output from an external circuit connected to the multistage amplifying circuit according to the present exemplary embodiment.

For example, when the first analog voltage $V_{A1}$ is 3.4 V, the first digital voltage $V_{D1}$ may be determined to be 3 V.

The second amplifying circuit 114 samples a second analog voltage $V_{A2}$ input thereto, or amplifies a difference $V_{A2}$-$V_{D2}$ between the second analog voltage $V_{A2}$ and a second digital voltage $V_{D2}$ converted from the second analog voltage $V_{A2}$, in response to the control signal. The second amplifying circuit 114 and the first amplifying circuit 112 complement each other.

In more detail, when the control signal is in the first logic state the switches Q1 are closed and the second amplifying circuit 114 amplifies the difference $V_{A2}$-$V_{D2}$ between the second analog voltage $V_{A2}$ and the second digital voltage $V_{D2}$ through a second amplifier 114a.

In addition, when the control signal is in the second logic state switches Q2 are closed and the second amplifying circuit 114 samples the second analog voltage $V_{A1}$ through capacitors C21, C22.

That is, the second amplifying circuit 114 performs an amplifying operation when the first amplifying circuit 112 performs a sampling operation. The second amplifying circuit 114 performs a sampling operation when the first amplifying circuit 112 performs an amplifying operation.

The common amplifier 120 receives a voltage output from the first amplifying circuit 112 and a voltage output from the second amplifying circuit 114. Then, the common amplifier 120 resets the voltage output from the first amplifying circuit 112 and determines an output voltage Vo output from the common amplifier 120 by using the second amplifying circuit 114 in response to the control signal. Alternatively, the common amplifier 120 resets the voltage output from the second amplifying circuit 114 and determines the output voltage Vo of the common amplifier 120 by using the first amplifying circuit 112, in response to the control signal.

In more detail, when the control signal is in the first logic state the switches Q1 are closed and the common amplifier 120 resets the output voltage of the first amplifying circuit 112 and determines the output voltage Vo by using the second amplifying circuit 114.

When the control signal is in the first logic state switches Q1 are closed and the output voltage Vo is determined according to the difference $V_{A2}$-$V_{D2}$ between the second analog voltage $V_{A2}$ and the second digital voltage $V_{D2}$, and the impedance of the capacitors C21, C22 included in the second amplifying circuit 114. In this regard, the output voltage Vo of the common amplifier 120 is the same as a value that is amplified from the output voltage of the second amplifier 114a by the common amplifier 120.

When the control signal is in the second logic state the switches Q2 are closed and the common amplifier 120 resets the output voltage of the second amplifying circuit 114 and determines the output voltage Vo by using the first amplifying circuit 112.

When the control signal is in the second logic state switches Q2 are closed and the output voltage Vo is determined according to the difference $V_{A1}$-$V_{D1}$ between the first analog voltage $V_{A1}$ and the first digital voltage $V_{D1}$, and the impedance of the capacitors C11, C12 included in the first amplifying circuit 112. In this regard, the output voltage Vo is the same as a value that is amplified from the output voltage of the first amplifier 112a by the common amplifier 120.

The compensation capacitor 130 is connected to an output terminal of the common amplifier 120 so as to stabilize the output voltage Vo.

The connection control unit 140 connects the compensation capacitor 130 connected to the output terminal of the common amplifier 120 to an output terminal of the first amplifying circuit 112 or an output terminal of the second amplifying circuit 114, in response to the control signal.

In more detail, when the control signal is in the first logic state switches Q1 are closed and the connection control unit 140 connects the compensation capacitor 130 connected to the output terminal of the common amplifier 120 to the output terminal of the second amplifying circuit 114. When the control signal is in the second logic state switches Q2 are closed and the connection control unit 140 connects the compensation capacitor 130 to the output terminal of the first amplifying circuit 112.

According to the present embodiment of the inventive concept, a voltage output from the first amplifier 112a is reset when the output voltage Vo of the common amplifier 120 is determined by the second amplifying circuit 114, and a voltage output from the second amplifier 114a is reset when the output voltage Vo of the common amplifier 120 is determined by the first amplifying circuit 112, in order to remove one of possible errors, that is, a memory effect, from occurring due to the first amplifier 112a or the second amplifier 114a.

For example, in FIG. 1, when the control signal is in the second logic state the switches Q2 are closed and the output voltage Vo of the common amplifier 120 is determined by the first amplifying circuit 112. Since input terminals of the common amplifier 120 are connected to both the first amplifier 112a and the second amplifier 114a, even if a small amount of voltage is applied to the input terminals of the common amplifier 120 through the second amplifier 114a, distortion referred to as a memory effect occurs in the output voltage Vo. Thus, in the present embodiment, when the control signal is in the second logic state switches Q2 are closed and the memory effect may be removed by resetting a voltage that is output from the second amplifier 114a and that is input to the common amplifier 120.

According to an exemplary embodiment of the inventive concept, when the common amplifier 120 outputs the output voltage Vo determined by the first amplifying circuit 112, the output voltage Vo may be input as the second analog voltage $V_{A2}$ to the second amplifying circuit 114, and the second digital voltage $V_{D2}$ is a digital voltage value of the second analog voltage $V_{A2}$ may be input to the second amplifying circuit 114.

In FIG. 1, the first analog voltage $V_{A1}$, the first digital voltage $V_{D1}$, the second analog voltage $V_{A2}$ and the second digital voltage $V_{D2}$ are input as single point inputs, and the output voltage of the first amplifier 112a, the output voltage of the second amplifier 114a and the output voltage Vo of the common amplifier 120 are output as single-ended outputs. Alternatively, the first analog voltage $V_{A1}$, the first digital voltage $V_{D1}$, the second analog voltage $V_{A2}$ and the second digital voltage $V_{D2}$ may be input as differential inputs, and therefore the output voltage of the first amplifier 112a, the output voltage of the second amplifier 114a and the output voltage Vo of the common amplifier 120 may be output as differential outputs.

Figure 2:
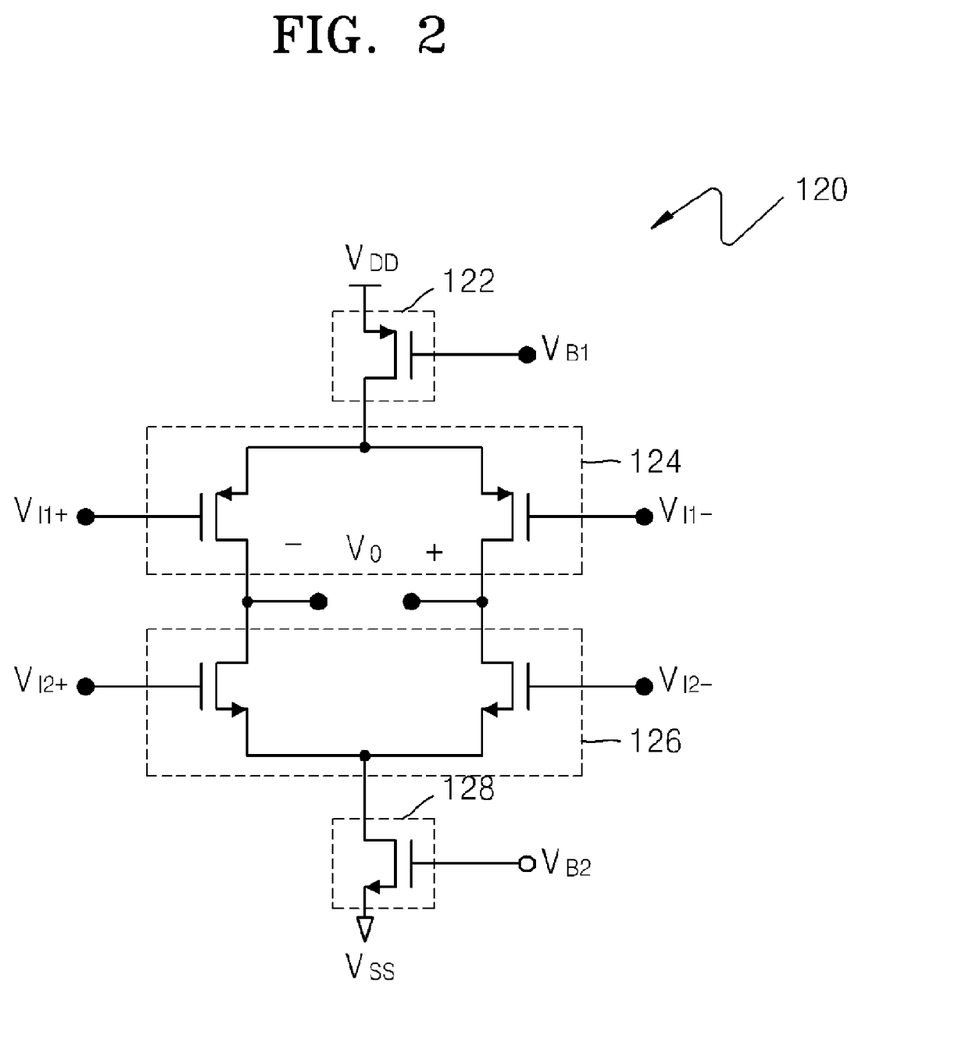
FIG. 2 is a circuit diagram of a common amplifier of FIG. 1, according to an exemplary embodiment of the inventive concept.

FIG. 2 is a circuit diagram of the common amplifier 120 of FIG. and illustrates an exemplary embodiment of the common amplifier 120 when the first amplifier 112a and the second amplifier 114a output voltages differentially.

Referring to FIGS. 1 and 2, the common amplifier 120 includes a first current generating unit 122, a first amplifying unit 124, a second amplifying unit 126 and a second current generating unit 128.

The first current generating unit 122 has an end connected to a first power voltage $V_{DD}$, and generates a current in response to a first bias voltage $V_{B1}$ applied to the first current generating unit 122.

The first amplifying unit 124 amplifies or resets output voltages $V_{I1+}, V_{I1-}$ of the first amplifying circuit 112 differentially input to the first amplifying unit 124 in response to the control signal.

In more detail, the first amplifying unit 124 includes two transistors. Each transistor is reset by receiving a reset voltage when the control signal is in the first logic state and the switches Q1 are closed. In addition, when the control signal is in the second logic state the switches Q2 are closed and each transistor respectively receives the output voltages $V_{I1+}, V_{I1-}$ of the first amplifying circuit 112 differentially and amplifies the output voltages $V_{I1+}, V_{I1-}$ of the first amplifying circuit 112.

In this case, the reset voltage may be a voltage having a voltage level of approximately 0 V.

The second amplifying unit 126 amplifies or resets output voltages $V_{I2+}, V_{I2-}$ of the second amplifying circuit 114 input differentially in response to the control signal.

In more detail, the second amplifying unit 126 includes two transistors. When the control signal is in the first logic state the switches Q1 are closed and each transistor respectively receives the output voltages $V_{I2+}, V_{I2-}$ of the second amplifying circuit 114 differentially, and amplifies the output voltages $V_{I2+}, V_{I2-}$ of the second amplifying circuit 114. In addition, when the control signal is in the second logic state the switches Q2 are closed and each transistor is reset by receiving the reset voltage.

As illustrated in FIG. 2, transistors of the first amplifying unit 124 and transistors of the second amplifying unit 126 may have different type each other.

The second current generating unit 128 is connected to a second power voltage Vss, and generates a current in response to a second bias voltage $V_{B2}$.

In this case, the amount of the current generated by the second current generating unit 128 may be the same as the amount of the current generated by the first current generating unit 122.

Figure 3:
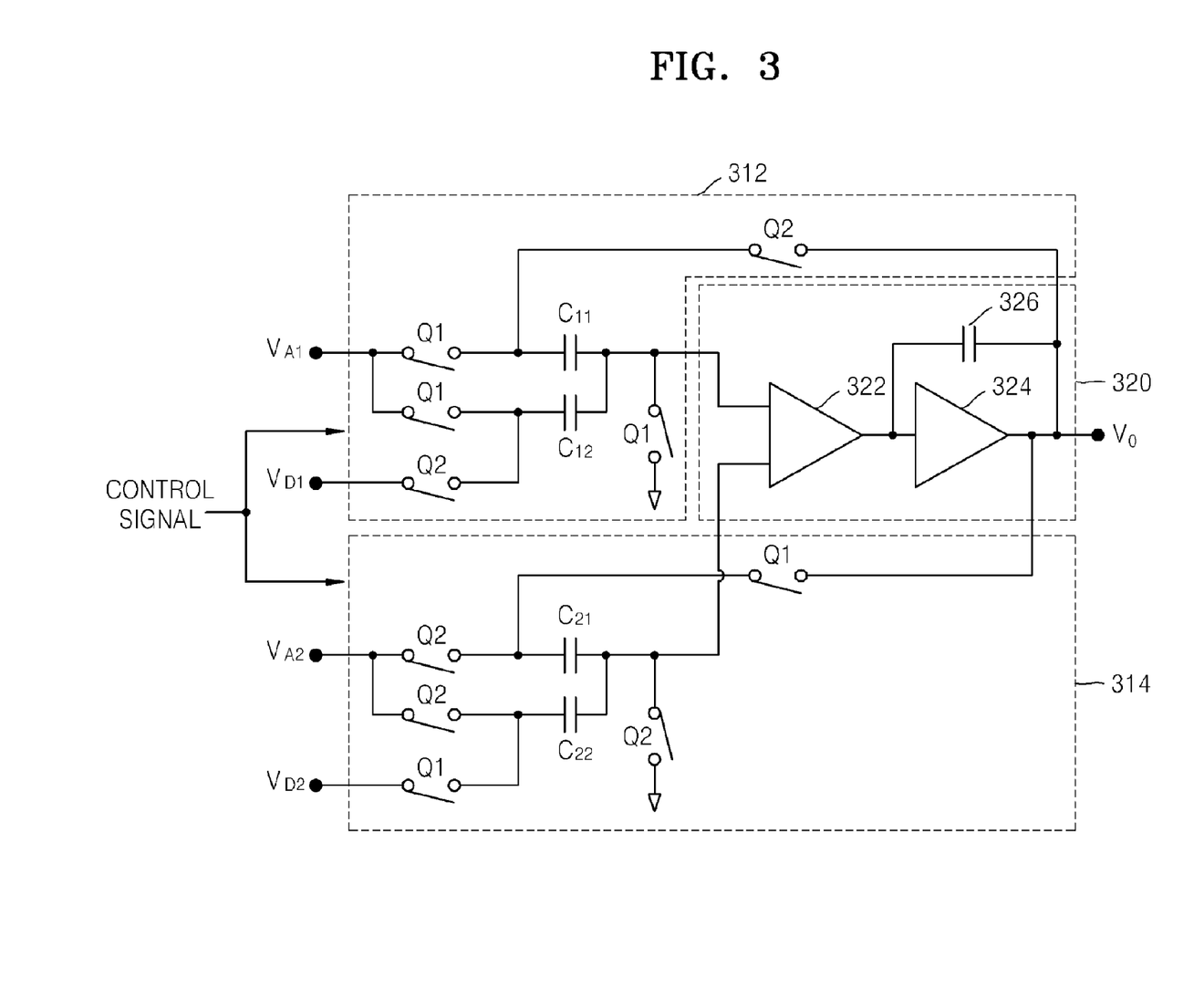
FIG. 3 is a circuit diagram of a multistage amplifying circuit according to an exemplary embodiment of the inventive concept.

FIG. 3 is a circuit diagram of a multistage amplifying circuit according to an exemplary embodiment of the inventive concept. The multistage amplifying circuit includes a first control circuit 312, a second control circuit 314 and a common amplifying circuit 320.

The first control circuit 312 samples a first analog voltage $V_{A1}$ input thereto, or amplifies a first input voltage as a difference $V_{A1}-V_{D1}$ between the first analog voltage $V_{A1}$ and a first digital voltage $V_{D1}$ through the common amplifying circuit 320, and determines an output voltage Vo of the common amplifying circuit 320, in response to a control signal.

In more detail, when the control signal is in a first logic state the switches Q1 are closed and the first control circuit 312 samples the first analog voltage $V_{A1}$ through capacitors C11, C12.

In addition, when the control signal is in a second logic state the switches Q2 are closed and the first control circuit 312 amplifies the first input voltage as the difference $V_{A1}-V_{D1}$ between the first analog voltage $V_{A1}$ and a first digital voltage $V_{D1}$ through the common amplifying circuit 320.

The second control circuit 314 samples a second analog voltage $V_{A2}$ input thereto, or amplifies a second input voltage as a difference $V_{A2}-V_{D2}$ between the second analog voltage $V_{A2}$ and the second digital voltage $V_{D2}$ through the common amplifying circuit 320 and determines the output voltage Vo of the common amplifying circuit 320, in response to the control signal. The second control circuit 314 and the first control circuit 312 complement each other.

In more detail, when the control signal is in the first logic state the switches Q1 are closed and the second control circuit 314 amplifies the second input voltage as the difference $V_{A2}-V_{D2}$ between the second analog voltage $V_{A2}$ and the second digital voltage $V_{D2}$ through the common amplifying circuit 320.

In addition, when the control signal is in the second logic state the switches Q2 are closed and the second control circuit 314 samples the second analog voltage $V_{A2}$ through the capacitors C21, C22.

The common amplifying circuit 320 receives a first input voltage and a second input voltage respectively from the first control circuit 312 and the second control circuit 314. Then, the common amplifying circuit 320 resets the first input voltage, and amplifies the second input voltage, in response to the control signal. Alternatively, the common amplifying circuit 320 resets the second input voltage, and amplifies the first input voltage, in response to the control signal.

The common amplifying circuit 320 includes a first common amplifier 322, a second common amplifier 324 and a compensation capacitor 326.

The first common amplifier 322 receives the first input voltage and the second input voltage. Then, the first common amplifier 322 resets the first input voltage, and amplifies the second input voltage primarily, in response to the control signal. Alternatively, the first common amplifier 322 resets the second input voltage, and amplifies the first input voltage primarily.

The second common amplifier 324 amplifies an output voltage of the first common amplifier 322 secondarily.

The compensation capacitor 326 is connected between an output terminal of the first common amplifier 322 and an output terminal of the second common amplifier 324 so as to stabilize an output voltage Vo of the second common amplifier 324.

The multistage amplifying circuit of FIG. 3 is configured such that the number of amplifiers used in the multistage amplifying circuit of FIG. 3 is less than that of the multistage amplifying circuit of FIG. 1 by one, and thus size and power consumption of the multistage amplifying circuit of FIG. 3 may be reduced as compared to that of the multistage amplifying circuit of FIG. 1.

Figure 4A:
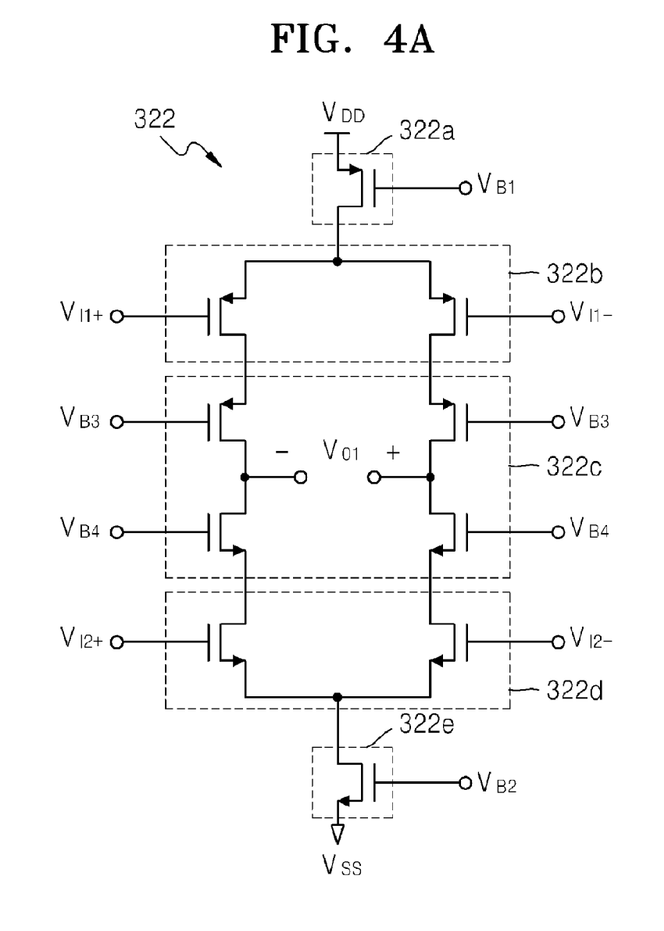
FIGS. 4a and 4b are a set of circuit diagrams of a first common amplifier and a second common amplifier, respectively, according to an exemplary embodiment of the inventive concept.
Figure 4B:
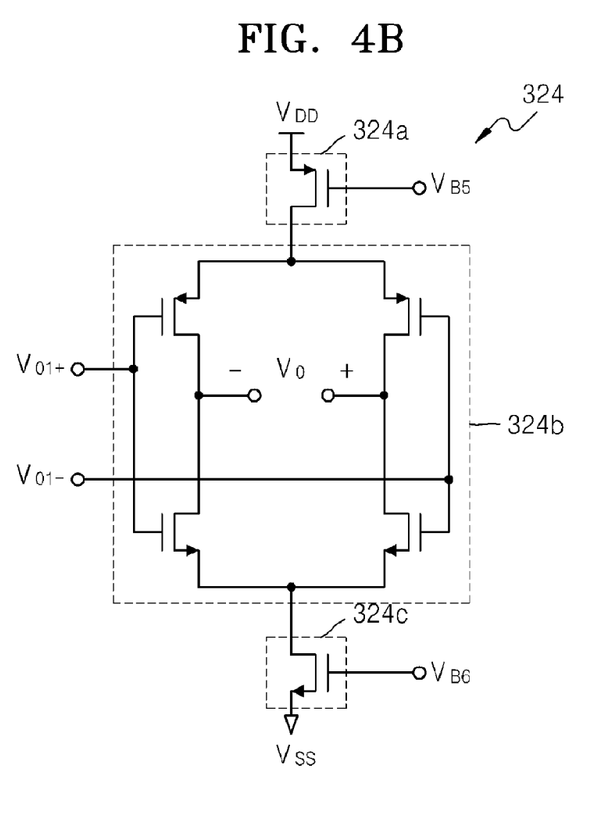

FIGS. 4a and 4b are a set of circuit diagrams of a first common amplifier 322 and a second common amplifier 324, according to an exemplary embodiment of the inventive concept.

Referring to FIG. 4a, the first common amplifier 322 includes a first current generating unit 322a, a first amplifying unit 322b, a gain elevation unit 322c, a second amplifying unit 322d and a second current generating unit 322e.

The first current generating unit 322a has an end connected to a first power voltage $V_{DD}$, and generates a current in response to a first bias voltage $V_{B1}$ applied to the first current generating unit 322a.

The first amplifying unit 322b amplifies or resets first input voltages $V_{I1+}$, $V_{I1}$ that are differentially output from the first control circuit 312 of FIG. 3, in response to a control signal.

In more detail, the first amplifying unit 322b includes two transistors. Each transistor is reset by receiving a reset voltage when the control signal is in a first logic state and the switches Q1 are closed. In addition, when the control signal is in a second logic state the switches Q2 are closed and each transistor respectively receives the first input voltages $V_{I1+}$, $V_{I1}$ differentially and amplifies the first input voltages $V_{I1+}$, $V_{I1}$.

The second amplifying unit 322d amplifies second input voltages $V_{I2+}$, $V_{I2-}$ that are differentially output from the second control circuit 314 of FIG. 3, in response to the control signal.

In more detail, the second amplifying unit 322d includes two transistors. When the control signal is in the first logic state the switches Q1 are closed and each transistor respectively receives the second input voltages $V_{I2+}$, $V_{I2-}$ differentially, and amplifies the second input voltages $V_{I2+}$, $V_{I2-}$. When the control signal is in the second logic state the switches Q2 are closed and each transistor is reset by receiving the reset voltage.

As illustrated in FIG. 4, the first amplifying unit 322b and the second amplifying unit 322d may include different types of transistors.

The gain elevation unit 322c may elevate the voltage amplifying rate of the first amplifying unit 322b, or may elevate the voltage amplifying rate of the second amplifying unit 322d.

In more detail, the gain elevation unit 322c includes four transistors. The transistors respectively output output voltages $V_{o1-}$, $V_{o1+}$ determined by elevating the voltage amplifying rate of the first amplifying unit 322b, or the transistors respectively output output voltages $V_{o1-}$, $V_{o1+}$ determined by elevating the voltage amplifying rate of the second amplifying unit 322d, in response to a third bias voltage $V_{B3}$ and a fourth bias voltage $V_{B4}$ that are respectively applied to the transistors.

The second current generating unit 322e is connected to a second power voltage Vss, and generates a current in response to a second bias voltage $V_{B2}$ applied to the second current generating unit 322e.

In this case, the amount of the current generated by the second current generating unit 322e may be the same as the amount of the current generated by the first current generating unit 322a.

Referring to FIG. 4b, the second common amplifier 324 includes a third current generating unit 324a, a third amplifying unit 324b and a fourth current generating unit 324c.

The third current generating unit 324a has an end connected to the first power voltage $V_{DD}$, and generates a current in response to a fifth bias current $V_{B5}$ applied to the third current generating unit 324a.

The third amplifying unit 324b receives and amplifies the output voltages $V_{o1-}$, $V_{o1+}$ of the first common amplifier 322, and determines output voltages $V_{o-}$, $V_{o+}$ of the second common amplifier 324.

The fourth current generating unit 324c has an end connected to the second power voltage Vss, and generates a current in response to a sixth bias voltage $V_{B6}$ applied to the fourth current generating unit 324c.

Figure 5A:
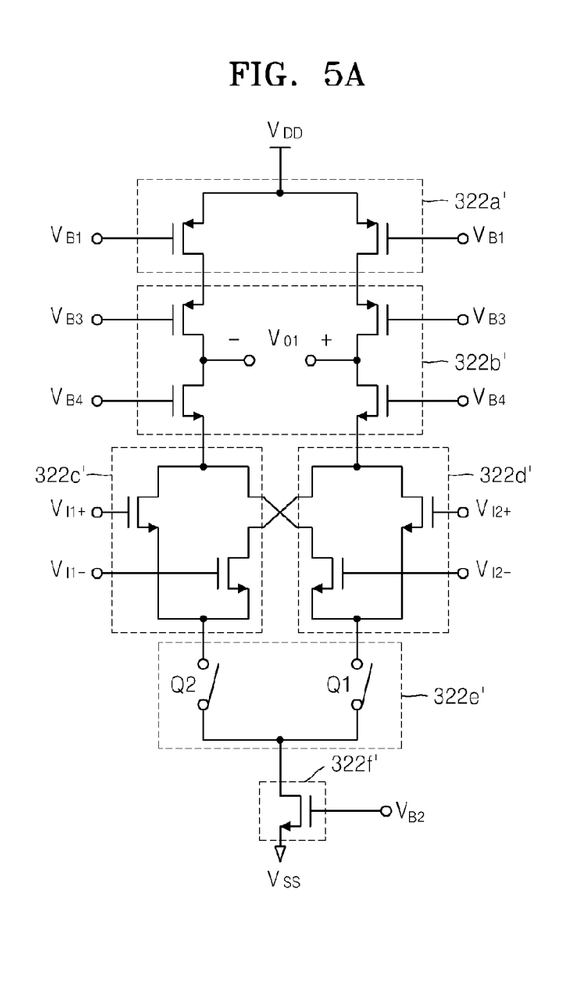
FIGS. 5a and 5b are a set of circuit diagrams of a first common amplifier and a second common amplifier, respectively, according to an exemplary embodiment of the inventive concept.
Figure 5B:
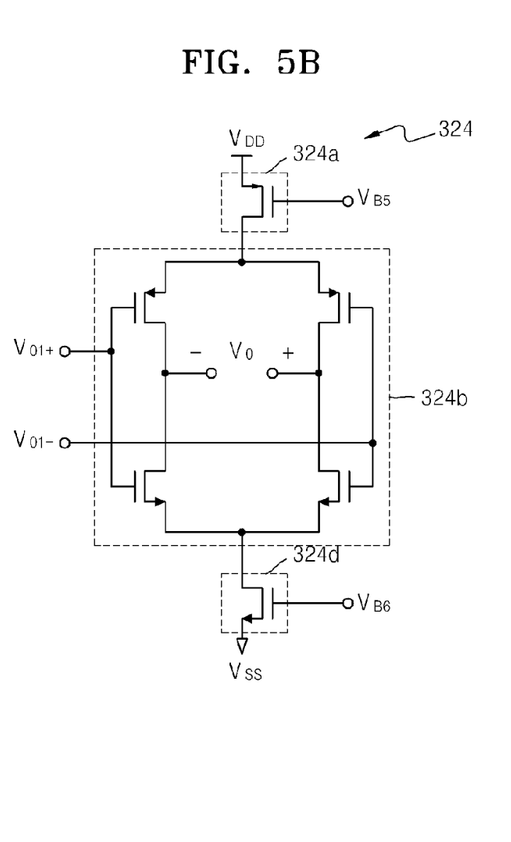

FIGS. 5a and 5b are a set of circuit diagrams of a first common amplifier 322' and a second common amplifier 324, according to an exemplary embodiment of the inventive concept.

Referring to FIG. 5a, the first common amplifier 322' includes a first current generating unit 322a', a gain elevation unit 322b', a first amplifying unit 322c', a second amplifying unit 322d', a connection control unit 322e' and a second current generating unit 322f.

The first current generating unit 322a' has an end connected to a first power voltage $V_{DD}$, and generates a current in response to a first bias voltage $V_{B1}$.

The first current generating unit 322a' of FIG. 5a receives the first bias voltage $V_{B1}$ through two transistors, compared to one transistor in FIG. 4.

The first amplifying unit 322c' amplifies first input voltages $V_{I1+}$, $V_{I1-}$ differentially output from the first control circuit 312 of FIG. 3.

The second amplifying unit 322d' amplifies second input voltages $V_{I2+}$, $V_{I2-}$ differentially output from the second control circuit 314 of FIG. 3.

As illustrated in FIG. 5a, the first amplifying unit 322c' and the second amplifying unit 322d' may include the same type of transistors.

The gain elevation unit 322b' elevates the voltage amplifying rate of the first amplifying unit 322c', or elevates the voltage amplifying rate of the second amplifying unit 322d'.

The connection control unit 322e' may connect the first amplifying unit 322c' to the second current generating unit 322f, or may connect the second amplifying unit 322d' to the second current generating unit 322f, in response to a control signal.

In more detail, when the control signal is in the first logic state the switches Q1 are closed and the connection control unit 322e' connects the second amplifying unit 322d' to the second current generating unit 322f. Thus, the first input voltages $V_{n+}$, $V_{I1-}$ input to the first amplifying unit 322c' may be reset, and the second amplifying unit 322d may amplify the second input voltages $V_{I2+}$, $V_{I2-}$.

In addition, when the control signal is in the second logic state and the switches Q2 are closed, by connecting the first amplifying unit 322c' to the second current generating unit 322f, the second input voltages $V_{I2+}$, $V_{I2-}$ input to the second amplifying unit 322d' may be reset, and the first amplifying unit 322c' may amplify the first input voltages $V_{I1+}$, $V_{I1-}$.

The second current generating unit 322f is connected to a second power voltage Vss, and generates a current in response to a second bias voltage $V_{B2}$.

In this case, the amount of the current generated by the second current generating unit 322f' may be the same as the amount of the current generated by the first current generating unit 322a'.

The second common amplifier 324 of FIG. 5b performs the same operation as that of the second common amplifier 324 of FIG. 4, and thus a detailed description of the second common amplifier 324 of FIG. 5 will be omitted.

Instructions for operating the control signals of the exemplary embodiments, for example, instructions for setting a desired first logic state or second logic state, can be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and the like.

While the inventive concept has been particularly shown and described with reference to exemplary embodiments thereof, it will be understood that various changes in form and details may be made therein without departing from the spirit and scope of the following claims.

What is claimed is:

1. A multistage amplifying circuit comprising:
   a first amplifying circuit that, alternatively in response to a control signal:
      samples a first analog voltage input to the first amplifying circuit, or
      amplifies a difference between the first analog voltage and a first digital voltage converted from the first analog voltage,
   a second amplifying circuit that, alternatively in response to the control signal:
      samples a second analog voltage input to the second amplifying circuit, or
      amplifies a difference between the second analog voltage and a second digital voltage converted from the second analog voltage,
   wherein the first amplifying circuit and the second amplifying circuit complement each other; and
   a common amplifier that receives an output voltage of the first amplifying circuit and an output voltage of the second amplifying circuit,
   wherein the common amplifier, alternatively in response to the control signal:
      resets the output voltage of the first amplifying circuit and determines an output voltage by using the second amplifying circuit, or
      resets the output voltage of the second amplifying circuit and determines the output voltage by using the first amplifying circuit.

2. The multistage amplifying circuit of claim 1, further comprising:
   a first capacitor having a first end connected to an output terminal of the common amplifier; and
   a connection control unit having an end connected to a second end of the first capacitor, and that connects the first capacitor to an output terminal of the first amplifying circuit or an output terminal of the second amplifying circuit, in response to the control signal.

3. The multistage amplifying circuit of claim 1, wherein the first amplifying circuit comprises:
   a first amplifier having an output terminal connected to a first input terminal of the common amplifier;
   a second capacitor and a third capacitor each having a first end connected to an input terminal of the first amplifier;
   a second switch and a third switch each having an end respectively connected to a second end of each of the second capacitor and the third capacitor, and that applies the first analog voltage to the second capacitor and the third capacitor, in response to the control signal;
   a fourth switch having an end connected to the second end of the third capacitor, and that applies the first digital voltage to the third capacitor, in response to the control signal; and
   a fifth switch having an end connected to the second end of the second capacitor, and that connects the second capacitor to an output terminal of the common amplifier, in response to the control signal.

4. The multistage amplifying circuit of claim 1, wherein the second amplifying circuit comprises:
   a second amplifier connected to an output terminal connected to a second input terminal of the common amplifier;
   a fourth capacitor and a fifth capacitor each having a first end connected to an input terminal of the second amplifier;
   a sixth switch and a seventh switch each having an end respectively connected to a second end of each of the fourth capacitor and the fourth capacitor, and that applies the second analog voltage to the fourth capacitor and the fifth capacitor, in response to the control signal;
   an eighth switch having an end connected to the second end of the fifth capacitor, and that applies the second digital voltage to the fifth capacitor, in response to the control signal; and
   a ninth switch having an end connected to the second end of the fourth capacitor, and that connects the fourth capacitor to an output terminal of the common amplifier, in response to the control signal.

5. The multistage amplifying circuit of claim 1, wherein the common amplifier comprises:
   a first current generating unit having a first end connected to a first power voltage, and that generates a current in response to a first bias voltage applied to the first current generating unit;
   a first amplifying unit having a first end connected to a second end of the first current generating unit, and that amplifies or that resets the output voltage of the first amplifying circuit differentially input in response to the control signal;
   a second amplifying unit having a first end connected to a second end of the first amplifying unit, and that amplifies or that resets the output voltage of the second amplifying circuit differentially input in response to the control signal, wherein the first amplifying unit and the second amplifying unit complement each other; and
   a second generating unit having an end connected to a second end of the second amplifying unit, and that generates a current in response to a second bias voltage applied to the second generating unit.

6. The multistage amplifying circuit of claim 1, wherein the second analog voltage is an output voltage of the common amplifier determined by using the first amplifying circuit.

7. A multistage amplifying circuit comprising:
   a common amplifying circuit that receives a first input voltage and a second input voltage, wherein the common amplifying circuit is configured to alternatively in response to a control signal:
      reset the first input voltage and amplify the second input voltage, or
      reset the second input voltage and amplify the first input voltage;

a first control circuit that, alternatively in response to the control signal:
   samples a first analog voltage input to the first control circuit, or
   amplifies the first input voltage as a difference between the first analog voltage and a first digital voltage converted from the first analog voltage by using the common amplifying circuit,
to determine an output voltage of the common amplifying circuit; and
a second control circuit that, alternatively in response to the control signal:
   samples a second analog voltage input to the second control circuit, or
   amplifies the second input voltage as a difference between the second analog voltage and a second digital voltage converted from the second analog voltage by using the common amplifying circuit,
to determine an output voltage of the common amplifying circuit,
wherein the first control circuit and the second control circuit complement each other.

8. The multistage amplifying circuit of claim 7,
wherein the common amplifying circuit comprises:
   a first common amplifier that receives the first input voltage and the second input voltage, wherein, in response to the control signal, the first common amplifier is configured to reset the first input voltage and to amplify the second input voltage, or to reset the second input voltage and amplify the first input voltage,
   a second common amplifier that amplifies an output voltage of the first common amplifier; and
   a capacitor having a first end connected to an output terminal of the first common amplifier, and a second end connected to an output terminal of the second common amplifier.

9. The multistage amplifying circuit of claim 7, wherein the first common amplifier comprises:
   a first current generating unit having a first end connected to a first power voltage, and that generates a current in response to a first bias voltage applied to the first current generating unit;
   a first amplifying unit having a first end connected to a second end of the first current generating unit, and that amplifies or resetting the first input voltage that is differentially input in response to the control signal;
   a second amplifying unit that amplifies or resets the second input voltage differentially input in response to the control signal, wherein the first amplifying unit and the second amplifying unit complement each other;
   a gain elevation unit having a first end connected to a second end of the first amplifying unit, and a second end connected to a first end of the second amplifying unit, wherein the gain elevation unit is configured to elevate a voltage amplifying rate of the first amplifying unit or to elevate a voltage amplifying rate of the second amplifying unit; and
   a second current generating unit connected to a second end of the second amplifying unit, and that generates a current in response to a second bias voltage applied to the second current generating unit.

10. The multistage amplifying circuit of claim 7, wherein the first common amplifier comprises:
   a first current generating unit having a first end connected to a first power voltage, and that generates a current in response to a first bias voltage applied to the first current generating unit;
   a first amplifying unit that amplifies the first input voltage differentially input in response to the control signal;
   a second amplifying unit that amplifies the second input voltage differentially input in response to the control signal;
   a gain elevation unit having a first end connected to a second end of the first current generating unit, and a second end connected to an end of the first amplifying unit and an end of the second amplifying unit, wherein the gain elevation unit is configured to elevate a voltage amplifying rate of the first amplifying unit, or to elevate a voltage amplifying rate of the second amplifying unit;
   a second current generating unit having a first end connected to a second power voltage, and that generates a current in response to a second bias voltage applied to the second current generating unit; and
   a connection control unit having an end connected to a second end of the second current generating unit, and that connects a second end of the first amplifying unit or a second end of the second amplifying unit to a second end of the second current generating unit, in response to the control signal.

11. A multistage amplifier circuit comprising:
   a first amplifying circuit that, in response to a control signal, either samples a first analog voltage input or amplifies a difference between the first analog voltage and a first digital voltage converted from the first analog voltage;
   a second amplifying circuit that, in response to the control signal, either samples a second analog voltage input or amplifies a difference between the second analog voltage and a second digital voltage converted from the second analog voltage; and
   a common amplifier that, in response to the control signal, receives output voltages of the first amplifying circuit and the second amplifying circuit and either:
      resets the output voltage of the first amplifying circuit and determines an output voltage of the multistage amplifier circuit by using the second amplifying circuit, or
      resets the output voltage of the second amplifying circuit and determines an output voltage of the multistage amplifier circuit by using the first amplifying circuit.

12. The multistage amplifier circuit of claim 11, wherein the second amplifying circuit is configured to perform an amplifying operation when the first amplifying circuit performs a sampling operation and is configured to perform a sampling operation when the first amplifying circuit performs an amplifying operation.

13. The multistage amplifier circuit of claim 11, wherein the control signal can be of a first logic state or a second logic state.

14. The multistage amplifier circuit of claim 13,
wherein when the control signal is in the first logic state:
   the first amplifying circuit samples the first analog voltage, and
   the second amplifying circuit amplifies the difference between the second analog voltage and the second digital voltage, and
wherein when the control signal is in the second logic state:
   the first amplifying circuit amplifies the difference between the first analog voltage and the first digital voltage, and
   the second amplifying circuit samples the second analog voltage.

15. The multistage amplifier circuit of claim 13,
wherein when the control signal is in the first logic state the common amplifier resets the output voltage of the first amplifying circuit and determines the output voltage of the multistage amplifier circuit using the second amplifying circuit, and wherein when the control signal is in the second logic state the common amplifier resets the output voltage of the second amplifying circuit and determines the output voltage of the multistage amplifier circuit using the first amplifying circuit.

16. The multistage amplifier of claim 13, further comprising:

a compensation capacitor; and connection control unit configured to connect the compensation capacitor between an output terminal of the common amplifier and an output terminal of the first amplifying circuit or between the output terminal of the common amplifier and an output terminal of the second amplifying circuit, wherein when the control signal is in the first logic state the connection control unit connects the compensation capacitor to the output terminal of the second amplifying circuit and when the control signal is in the second logic state the connection control unit connects the compensation capacitor to the output terminal of the first amplifying circuit.

* * * * *